United States Patent

Kosiec et al.

[11] Patent Number: 5,838,202
[45] Date of Patent: Nov. 17, 1998

[54] ERROR SUPPRESSING CIRCUIT AND METHOD THEREFOR FOR A PHASE LOCKED LOOP

[75] Inventors: Jeannie Han Kosiec, Schaumburg; Steven Frederick Gillig, Roselle, both of Ill.

[73] Assignee: Motorola, Inc., Schaumburg, Ill.

[21] Appl. No.: 691,437

[22] Filed: Aug. 1, 1996

Related U.S. Application Data

[63] Continuation of Ser. No. 436,547, May 8, 1995, abandoned, which is a continuation of Ser. No. 149,684, Nov. 9, 1993, abandoned.

[51] Int. Cl.[6] ............................................. H03L 7/18
[52] U.S. Cl. ........................ 331/1 A; 331/16; 331/14; 331/25; 327/156; 327/159
[58] Field of Search .............................. 331/1 A, 16, 14, 331/25, 17, 18; 455/75, 76, 260; 327/156, 159; 375/376

[56] References Cited

U.S. PATENT DOCUMENTS

| | | | |
|---|---|---|---|
| 3,921,095 | 11/1975 | Chu | 331/1 A |
| 4,061,979 | 12/1977 | Walker et al. | 331/17 X |
| 4,238,740 | 12/1980 | Crue | 331/17 |
| 4,365,210 | 12/1982 | Harrington et al. | 331/1 A |
| 4,389,622 | 6/1983 | Kackman | 332/19 |
| 4,419,633 | 12/1983 | Phillips | 331/17 |
| 4,625,180 | 11/1986 | Itaya et al. | 331/2 |
| 4,667,169 | 5/1987 | Matsuura et al. | 331/14 |
| 4,812,783 | 3/1989 | Honjo et al. | 331/20 |
| 4,841,255 | 6/1989 | Ohba et al. | 331/14 |
| 4,951,005 | 8/1990 | Babin | 331/16 |
| 5,008,629 | 4/1991 | Ohba et al. | 331/14 X |
| 5,103,192 | 4/1992 | Sekine et al. | 331/1 A |
| 5,124,669 | 6/1992 | Palmer et al. | 331/1 A |
| 5,128,632 | 7/1992 | Erhart et al. | 331/1 A |
| 5,304,951 | 4/1994 | Cosand | 331/1 A |

FOREIGN PATENT DOCUMENTS

WO8912931 12/1989 European Pat. Off. .

*Primary Examiner*—Robert Pascal
*Assistant Examiner*—Arnold Kinkead
*Attorney, Agent, or Firm*—Kevin D. Kaschke

[57] ABSTRACT

An error suppressing circuit (301) and method therefor for a phase locked loop (PLL) (300). According to one embodiment of the present invention, a transient condition, for example, a bandwidth switch, in the PLL (300) is detected. The PLL (300) is opened for a period of time (509) responsive to detecting the transient condition. The phase of a reference frequency signal (115) and the phase of a output frequency signal (116 or 117) are synchronized after a lapse of the period of time (509). The PLL (300) is closed responsive to the phase of the reference frequency signal (115) and the phase of the output frequency signal (116 or 117) being synchronized. The present envention advantageously reduces the length of time it takes for the PLL (300) to correct for the phase and frequency error generated by the transient condition, and is capable of operating with various types of PLLs.

7 Claims, 7 Drawing Sheets

-PRIOR ART-

ERROR SUPPRESSING CIRCUIT AND METHOD THEREFOR FOR A PHASE LOCKED LOOP

This is a continuation of application Ser. No. 08/436,547, filed May 8, 1995 and now abandoned which is a continuation of Ser. No. 08/149,684, filed Nov. 9, 1993 and now abandoned.

FIELD OF THE INVENTION

The present invention relates generally to radio communication transceivers and, more particularly, to an error suppressing circuit and method therefor for a phase locked loop in a radio communication transceiver.

BACKGROUND OF THE INVENTION

FIG. 1 illustrates, by example, a block diagram of a conventional radio communication transceiver 100 (hereinafter referred to as "transceiver"). The transceiver 100 enables a mobile or portable subscriber unit to communicate with a base station (not shown), for example, over radio frequency (RF) channels in a radio communication system (not shown). The base station thereafter provides communications with a landline telephone system (not shown) and other subscriber units. An example of a subscriber unit having the transceiver 100 is a cellular radiotelephone.

The transceiver 100 of FIG. 1 generally includes an antenna 101, a duplex filter 102, a receiver 103, a transmitter 105, a reference frequency signal source 107, a receive (Rx) phase locked loop (PLL) frequency synthesizer 108, a transmit (Tx) PLL frequency synthesizer 109, a processor 110, an information source 106, and an information sink 104.

The interconnection of the blocks of the transceiver 100 and operation thereof is described as follows. The antenna 101 receives a RF signal 119 from the base station for filtering by the duplex filter 102 to produce an RF received signal at line 111. The duplex filter 102 provides frequency selectivity to separate the RF received signal at line 111 and the RF transmit signal at line 113. The receiver 103 is coupled to receive the RF received signal at line 111 and operative to produce a received baseband signal at line 112 for the information sink 104. The reference frequency signal source 107 provides a reference frequency signal at line 115. The Rx PLL frequency synthesizer 108 is coupled to receive the reference frequency signal at line 115 and information on a data bus 118 and operative to produce a receiver tune signal at line 116 to tune the receiver 103 to a particular RF channel. Likewise, the Tx PLL frequency synthesizer 109 is coupled to receive the reference frequency signal at line 115 and information on the data bus 118 and operative to produce a transceiver tune signal at line 117 to tune the transmitter 105 to a particular RF channel. The processor 110 controls the operation of the Rx PLL frequency synthesizer 108, the Tx PLL frequency synthesizer 109, the receiver 103, and the transmitter 105 via the data bus 118. The information source 106 produces a baseband transmit signal at line 114. The transmitter 105 is coupled to receive the baseband transmit signal at line 114 and operative to produce the RF transmit signal at line 113. The duplex filter 102 filters the RF transmit signal at line 113 for radiation by the antenna 101 as a RF signal 120.

The RF channels in a cellular radiotelephone system, for example, include voice and signaling channels for transmitting and receiving (hereinafter referred to as "transceiving") information between the base station and the subscriber units. The voice channels are allocated for transceiving voice information. The signaling channels, also referred to as control channels, are allocated for transceiving data and signaling information. It is through these signaling channels that the subscriber units gain access to the cellular radiotelephone system and are assigned a voice channel for further communication with the landline telephone system. In cellular radiotelephone systems capable of transceiving wideband data on the signaling channels, the frequency spacing of the signaling channels may be a multiple of the frequency spacing of the voice channels.

In some cellular radiotelephone systems, the transceiver 100 and the base station intermittently transceive information therebetween on the signaling channel. One such system, for example, an interleaved data signaling method to synchronize the intermittent information. In this type of system, keeping the transceiver 100 fully powered during the entire time that the transceiver 100 is tuned to the signaling channel unnecessarily drains the transceiver's battery during those times when the information is not received. Therefore, portions of the transceiver 100 can be powered off to prolong battery life when the transceiver is not transceiving information. Further, portions of the transceiver 100 can be powered off to prolong battery life when the signal quality is good enough such that further repetition of the same information is not needed. Intermittently powering on and off, i.e. enabling and disabling, the transceiver 100 during its receive operation is called discontinuous receive (DRX) mode of operation. In the DRX mode of operation, quickly enabling and disabling the portions of transceiver 100 increases the savings in battery life.

FIG. 2 illustrates, by example, a block diagram of a conventional phase locked loop (PLL) frequency synthesizer for use in the transceiver 100 of FIG. 1. The general structure of the PLL frequency synthesizer of FIG. 2 is the same for both the Rx PLL frequency synthesizer 108 and the Tx PLL frequency synthesizer 109.

The PLL frequency synthesizer 108 or 109 of FIG. 2 generally includes a reference divider 201, for discussion purposes, and a PLL 212. The PLL 212 generally includes a phase detector 202, a loop filter 203, a voltage controlled oscillator 204, and a loop divider 205. The reference divider 201 receives a reference frequency signal on line 115.

The interconnection of the blocks of the PLL frequency synthesizer 108 or 109 is described as follows. The reference divider 201 is coupled to receive the reference signal at line 115 and the data bus 118 and operative to produce a divided reference frequency signal at line 206. The phase detector 202 is coupled to receive a divided reference frequency signal at line 206 and a feedback signal at line 209, and operative to produce a phase error signal at line 207. The loop filter 203 is coupled to receive the phase error signal 207, and operative to produce a filtered signal at line 208. The voltage controlled oscillator 204 is coupled to receive the filtered signal at line 208 and operative to produce an output frequency signal at line 116 or 117. The loop divider 205 is coupled to receive the output frequency signal at line 116 or 117, and operative to produce the feedback signal at line 209. The loop divider 205 and the reference divider 201 are coupled to receive programming information at the data bus 118.

The operation of the PLL frequency synthesizer 108 or 109 of FIG. 2 is described as follows. The PLL 212 is a circuit which produces the output frequency signal at line 116 or 117 synchronized to the reference frequency signal at line 115. The output frequency signal at line 116 or 117 is synchronized or "locked" to the reference frequency signal at line 115 when the frequency of the output frequency signal at line 116 or 117 has a predetermined frequency relationship to the frequency of the reference frequency signal at line 115. Under locked conditions, the 212 PLL typically provide a constant phase difference between the reference frequency signal at line 115 and the output frequency signal at line 116 or 117. The constant phase difference may assume any desired value including zero. Should a deviation in the desired phase difference of such signals develop, i.e., should a phase error at line 207 develop due to, e.g., variation in either the frequency of the reference frequency signal at line 115 or programmable parameters of the PLL via the data bus 118, the PLL adjusts the frequency of the output frequency signal at line 116 or 117 to drive the phase error at line 207 toward the value of the constant phase difference.

The PLL frequency synthesizer 108 or 109 may be classified as belonging to one of at least two categories based on the predetermined frequency relationship of the output signal frequency at line 116 or 117 to the frequency of the reference frequency signal at line 115. The first category is classified as an "integer division" PLL frequency synthesizer wherein the relationship between the output frequency signal at line 116 or 117 and reference frequency signal at line 115 is an integer. The second category is classified as a "fractional division" PLL frequency synthesizer in which the relationship between the output frequency signal at line 116 or 117 and reference frequency signal at line 115 is a rational, non-integer number, consisting of an integer and a fraction.

PLL's are characterized by a loop bandwidth. For some applications it is desirable to vary the loop bandwidth of the PLL under certain conditions such as, for example, when the frequency of the reference frequency signal at line 115 changes or when the programmable parameters of the PLL via the data bus 118 changes. Appropriately varying the loop bandwidth advantageously provides shorter locktime, improved noise, and lower spurious signals.

A problem exists in a PLL frequency synthesizer when the PLL undergoes a transient condition which produces a phase and/or frequency error within the PLL. Such a transient condition may be due, for example, to a load impedance change at the VCO or a change in the loop bandwidth between wide and narrow. Because a phase detector responds to phase, and not directly to frequency, a false frequency indication can exist for a short time period after the transient condition occurs. The resulting action of the PLL can momentarily drive the VCO further from its desired frequency.

One solution provided by the prior art has been to rely on the basic operation of the frequency steering phase detector to provide a correct phase and frequency indication under such circumstances. However, a disadvantage of this solution is the length of time it takes for the PLL to correct for the phase and frequency error generated by the transient condition.

Another solution provided by the prior art has been to force the PLL into a false lock condition at each cycle of the phase detector inputs by forcing the inputs to the phase detector to be in phase, although they would not necessarily be at the same frequency. However, a disadvantage of this solution is that for a fractional division PLL frequency synthesizer, where the output frequency is the result of accurate phase accumulation over many reference frequency periods, this solution will lead to a loss of the accumulated phase information. Therefore, this solution cannot be used with a fractional division PLL frequency synthesizer.

Accordingly, there is a need for an error suppressing circuit and method therefor for a phase locked loop that is capable of operating with various types of PLLs, and that overcomes the disadvantage of the length of time it takes for a PLL to correct for the phase and frequency error generated by a transient condition.

DETAILED DESCRIPTION OF A PREFERRED EMBODIMENT

In accordance with the present invention, the foregoing need is substantially met by an error suppressing circuit and method therefor for a phase locked loop (PLL). According to one embodiment of the present invention, a transient condition in the PLL is detected. The PLL is opened for a period of time responsive to detecting the transient condition. The phase of a reference frequency signal and the phase of a output frequency signal are synchronized after a lapse of the period of time. The PLL is closed responsive to the phase of the reference frequency signal and the phase of the output frequency signal being synchronized. The present invention advantageously reduces the length of time it takes for the PLL to correct for the phase and frequency error generated by the transient condition, and is capable of operating with various types of PLLs.

Figure 1:
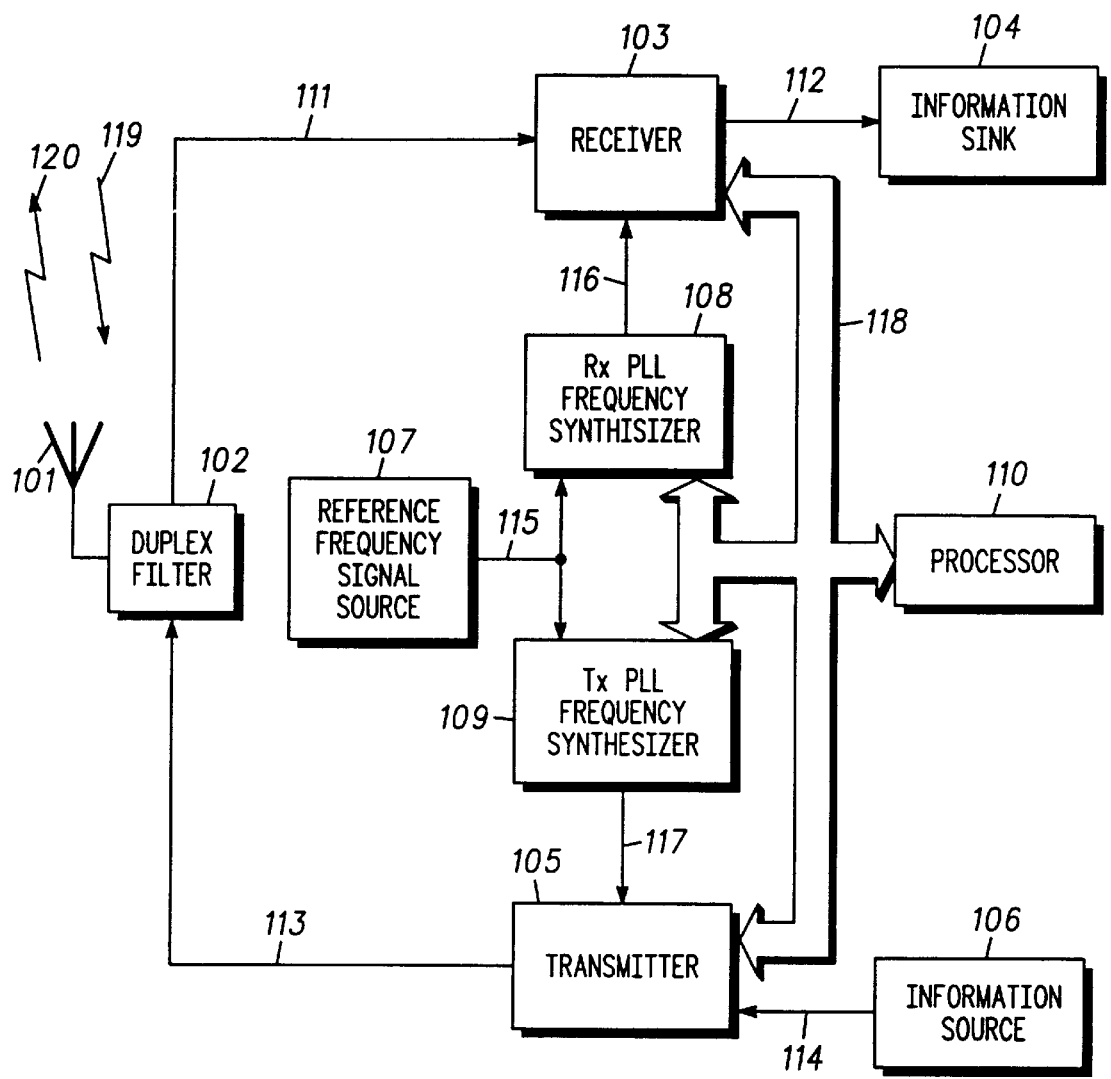
FIG. 1 illustrates a block diagram of a conventional radio communication transceiver.
Figure 2:
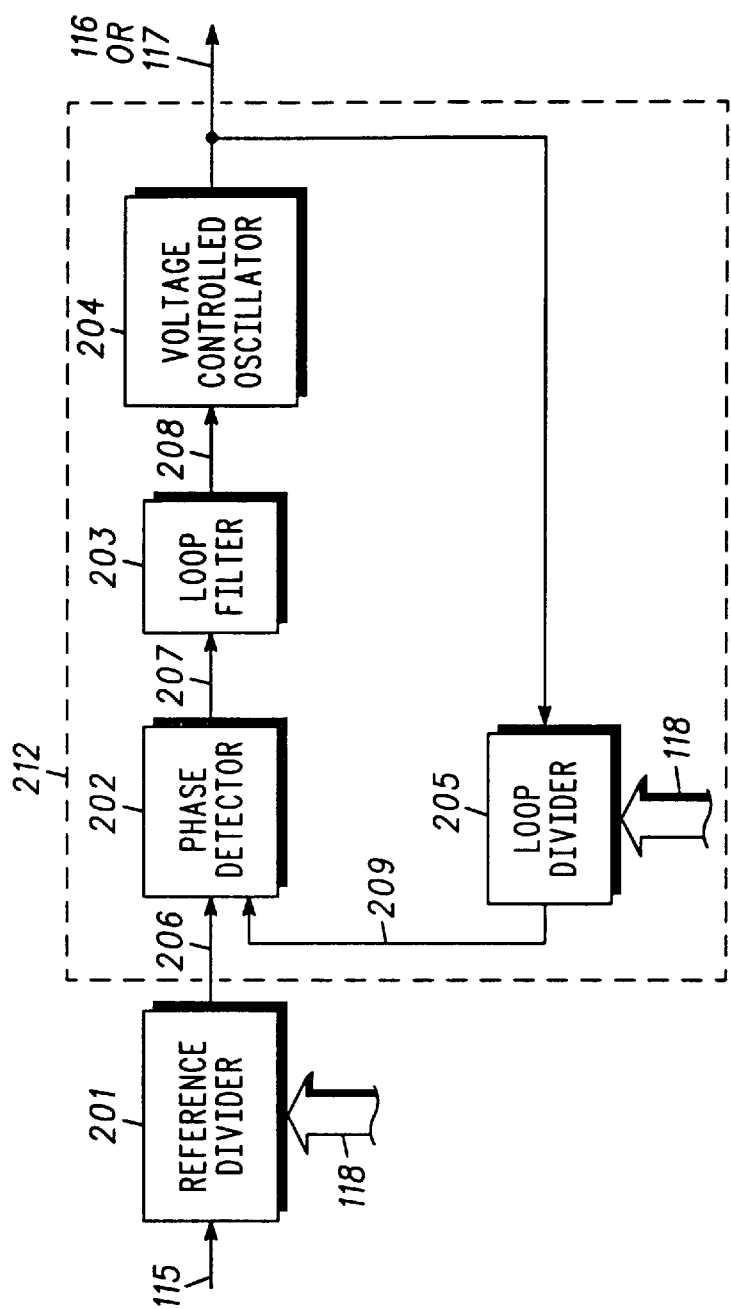
FIG. 2 illustrates a block diagram of a conventional phase locked loop frequency synthesizer for use in the radio communication transceiver of FIG. 1.
Figure 3:
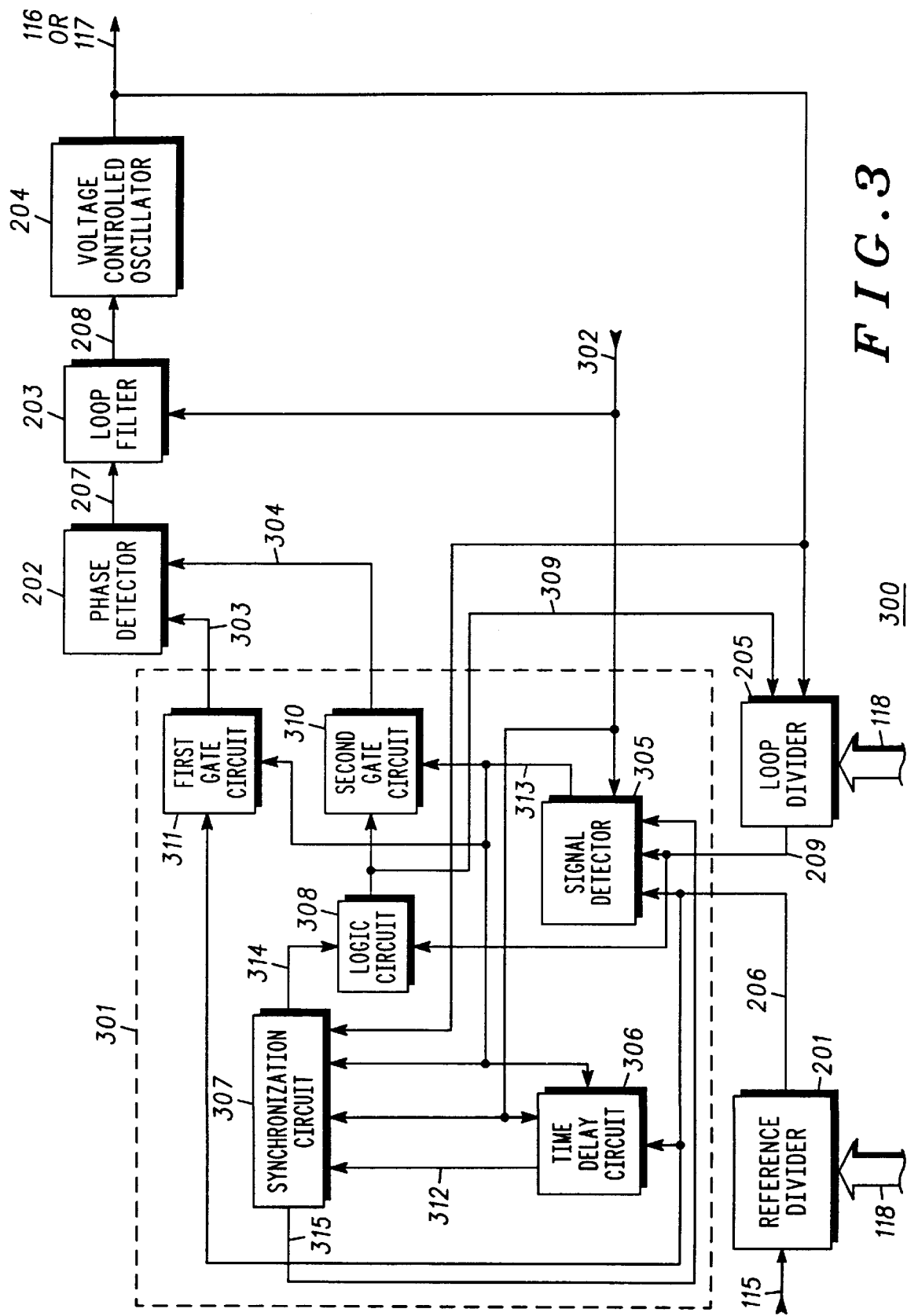
FIG. 3 illustrates a block diagram of a novel phase locked loop (PLL) for use in the radio communication transceiver of FIG.1 in accordance with the present invention.

The present invention can be more fully described with reference to FIGS. 3–7, wherein FIG. 3 illustrates a block diagram of a phase locked loop 300 in accordance with the present invention. The PLL 300 in FIG. 3 has substantially the same structure and operates in substantially the same manner as the prior art PLL 212 with the exception of a novel apparatus 301 and the associated method therefor. Therefore, in the preferred embodiment of the present invention, the novel PLL 300 is substituted for the prior art PLL 212 for use in the Rx PLL frequency synthesizer 108 or in the Tx PLL frequency synthesizer 109 in the transceiver 100 of FIG. 1. One of ordinary skill in the art of PLL design and application may find other applications for the novel PLL 300 both inside and outside the radio communications field.

The novel PLL circuit 300 generally includes a phase detector 202, a loop filter 203, a voltage controlled oscillator (VCO) 204, a loop divider 205, and a phase or frequency error suppressing circuit 301. Individually, the phase detector 202, the loop filter 203, the VCO 204, and the loop divider 205 are generally well known in the art; thus, no further discussion will be presented except to facilitate the understanding of the present invention. The novel phase or frequency error suppressing circuit 301 will be described and illustrated below with reference to FIGS. 3–6, in accordance with the present invention.

The novel PLL 300, with the exception of the novel phase or frequency error suppressing circuit 301, may be implemented, for example, using a Motorola MC145170 PLL frequency synthesizer and a Motorola MC1648 voltage controlled oscillator. The loop filter 205 may be implemented, for example, with standard resistors and capacitors in accordance with well known filter design techniques.

Generally, the novel PLL 300 operates as follows. The novel PLL 300 generates an output frequency signal 116 or 117 responsive to a reference frequency signal 115. The output frequency signal 116 or 117 and the reference frequency signal 115 are each characterized by frequency and phase. The frequency of the output frequency signal 116 or 117 is divided to produce a feedback signal 209. The PLL 300 is susceptible to generating a phase or frequency error in the output frequency signal 116 or 117 responsive to a transient condition.

The phase or frequency error generated is indicative of the difference between the phase of the reference frequency signal and the phase of the output frequency signal. The phase error or frequency may be produced by the transient condition of the PLL 300.

The transient condition may be a load impedance change at the VCO or a change in the loop bandwidth between wide and narrow.

The interconnections between the novel phase or frequency error suppressing circuit 301 and the conventional PLL loop 212 to form the novel PLL 300 are as follows. The novel phase or frequency error suppressing circuit 301 is coupled to receive an indication of the reference frequency signal at line 206, the feedback signal at line 209, the indication of a transient condition at line 302, and the output frequency signal at line 116 or 117. The novel phase or frequency error suppressing circuit 301 produces a synchronized feedback signal at line 309, a gated synchronized feedback signal at line 304, and a gated indication of the reference frequency signal at line 303.

The novel phase or frequency error suppressing circuit 301 further comprises a signal detector 305, a time delay circuit 306, a synchronization circuit 307, a logic circuit 308, a first gate circuit 311, and a second gate circuit 310. Individually, the signal detector 305, the time delay circuit 306, the logic circuit 308, the first gate circuit 311, and the second gate circuit 310 are well known in the art, and hence no additional description need be provided here except as may be necessary to facilitate the understanding of the present invention. The combination of the signal detector 305, the time delay circuit 306, the synchronization circuit 307, the logic circuit 308, the first gate circuit 311, and the second gate circuit 310 are considered to be novel elements of the present invention and will be described in further detail below.

Figure 7:
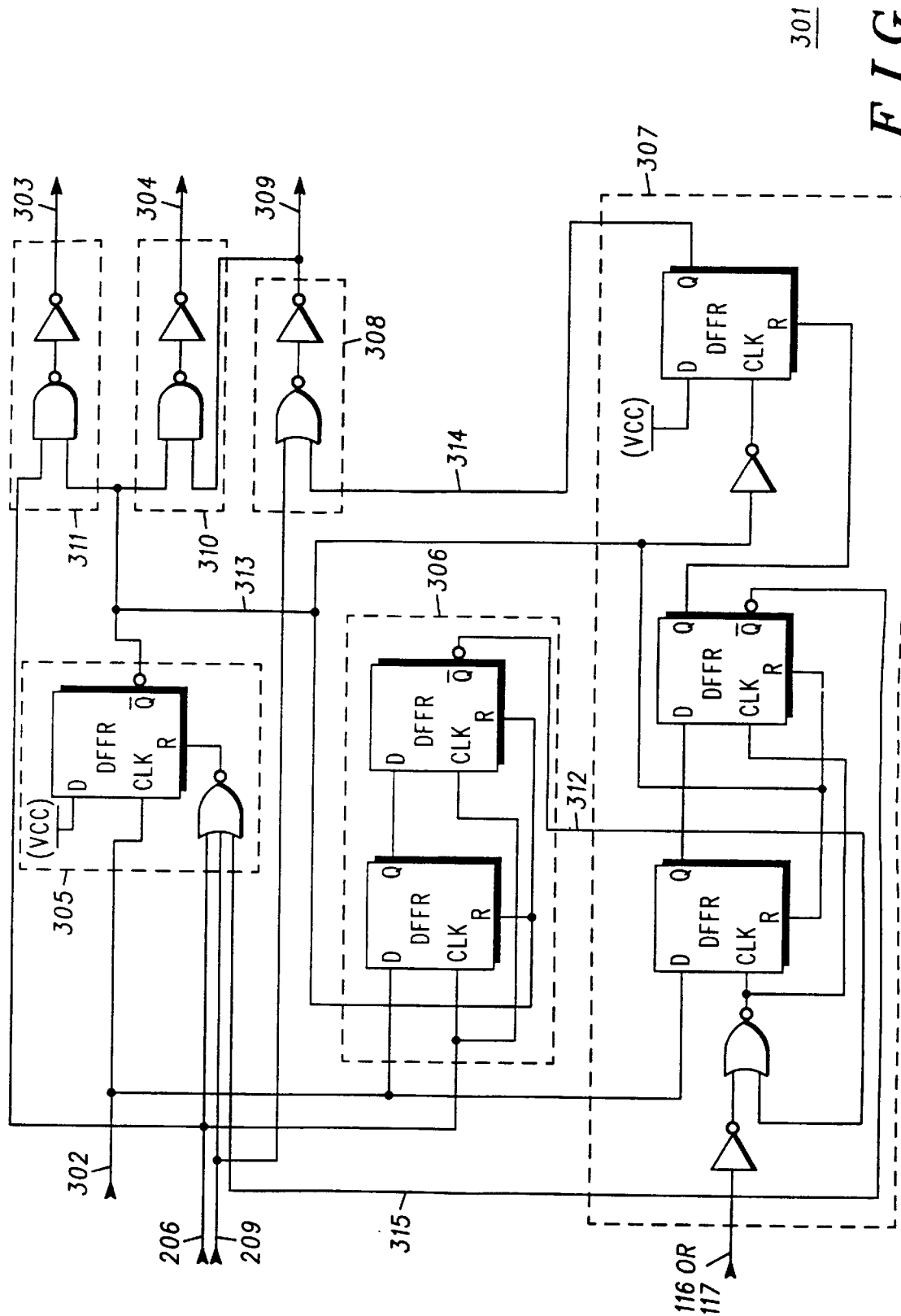
FIG. 7 illustrates a circuit implementation of a phase or frequency error suppressing circuit in the PLL of FIG. 3 in accordance with the present invention.

The signal detector 305, the time delay circuit 306, the synchronization circuit 307, the logic circuit 308, the first gate circuit 311, and the second gate circuit 310 may be implemented, for example, using standard logic elements. Such logic elements may include, for example, NAND gates as a Motorola MC74HC00, NOR gates such as a Motorola MC74HC02, and D-type flip-flops such as a Motorola MC74HC74 in accordance with well known logic design techniques. FIG. 7 illustrates a circuit implementation of a phase or frequency error suppressing circuit 301 in the PLL 300 of FIG. 3 in accordance with the present invention.

The interconnections between the blocks of the novel phase or frequency error suppressing circuit 301 are as follows. The signal detector 305 is coupled to receive an indication of the transient condition at line 302, an indication of the reference frequency signal at line 206, the feedback signal at line 209, and a reset signal at line 315, and operative to produce a control signal at line 313. The time delay circuit 306 is coupled to receive the indication of the transient condition at line 302, the indication of the reference frequency signal at line 206, and the control signal at line 313, and operative to produce a timing signal at line 312. The synchronization circuit is coupled to receive the indication of the transient condition at line 302, the output frequency signal at line 116 or 117, the control signal at line 313, and the timing signal at line 312, and operative to produce the reset signal at line 315 and a synchronization signal at line 314. The logic circuit 308 is coupled to receive the synchronization signal at line 314 and the feedback signal at line 209, and operative to produce a synchronized feedback signal at line 309. The first gate circuit 311 is operative to transmit the indication of the reference frequency signal at line 303 responsive to the control signal at line 313. The second gate circuit 310 is operative to transmit the synchronized feedback signal at line 304 responsive to the control signal at line 313.

The operation of the novel phase or frequency error suppressing circuit 301 is as follows. According to the present invention, the signal detector 305 and associated method therefor detects a transient condition. The PLL 300 is opened by the first and the second gate circuits 311 and 310, respectively, for a period of time. The time delay circuit 306 and associated method therefor determines the period of time responsive to the transient condition detected by the signal detector 305. The synchronization circuit 307 and associated method therefor synchronizes the phase of the indication of the reference frequency signal 206 and the phase of the output frequency signal 209 after a lapse of the period of time determined by the time delay circuit 306. The first and the second gate circuit 311 and 310, respectively, and the associated method therefor close the PLL 300 responsive to the control signal 313 generated by the signal detector 305. The control signal 313 indicates the completion of the synchronization of the phase of the indication of the reference frequency signal 206 and the phase of the output frequeny signal 209

The purpose of the novel phase or frequency error suppressing circuit 301 is to minimize or eliminate false frequency error reading resulted from frequency measurement of a temporarily disturbed output frequency when the transient condition occurs. The temporary disturbance may be caused by, for example, the switching current generated by a switch in a loop filter during a loop filter bandwidth switch operation. After the detection of a transient condition, the loop of the PLL is opened for a period of time to allow the disturbed output frequency 116 or 117 to settle. The time delay circuit 306 advantageously determines the length of time that the loop is to remain open. The synchronization circuit 307 advantageously reduces the phase error such that the remaining frequency error caused by the transient condition can be rapidly corrected by the PLL operation after the loop is closed.

The phase or frequency error suppressing circuit 301 of the PLL 300 can be used with various types of PLL frequency synthesizers including a fractional division PLL frequency synthesizer. The prior art method cannot work with the fractional division PLL frequency synthesizer because phase information lost. However, in the present invention, since the phase of the PLL 300 is synchronized after the lapse of the time period, the PLL 300 is advantageously permitted to retain the phase information.

Within the scope of the present invention, alternative interconnections between the novel phase or frequency error suppressing circuit 301 and the conventional PLL 212 may be implemented in accordance with the present invention. The time delay circuit 306 may alternatively be coupled to receive the reference frequency signal 115 in place of the indication of reference frequency signal 206. This connection may alternatively be eliminated for a time delay circuit 306 having a different implementation. The synchronization circuit 307 may alternatively be replaced by a synchronization circuit of a different scheme. The indication of the transient condition 302 may alternatively be coupled to other elements of the PLL 300 in accordance with well known design techniques.

The PLL 300 of FIG. 3 may also include a charge pump and a prescaler (both not shown), as is well known in the art. The prescaler would be used between the VCO 204 and the loop divider 205 in the feedback path at line 116 or 117 to permit higher the loop divider 205 to accept higher input frequencies from the VCO 204. The charge pump would be used at the output of the phase detector 202 to provide high DC loop gain for the PLL 308.

According to the preferred embodiment of the present invention, the steps of opening and closing the loop of the PLL further comprises disabling and enabling, respectively, the phase detector 202 of the PLL 300. The present invention advantageously eliminates the need for a switch, which causes phase error, at the input or the output of the loop filter 203.

According to the preferred embodiment of the present invention, the period of time is predetermined. The predetermined period of time is dependent upon the design requirements of the PLL 300 and the expected level of phase and frequency error introduced to the PLL 300 by the transient condition.

Alternatively, the period of time may be responsive to the duration of the phase or frequency error generated in the output frequency signal responsive to the transient condition. This may be accomplished by a circuit which indicates the rate of change of the phase or frequency of the output frequency signal 116 or 117 after the transient condition occurs.

Figure 4:
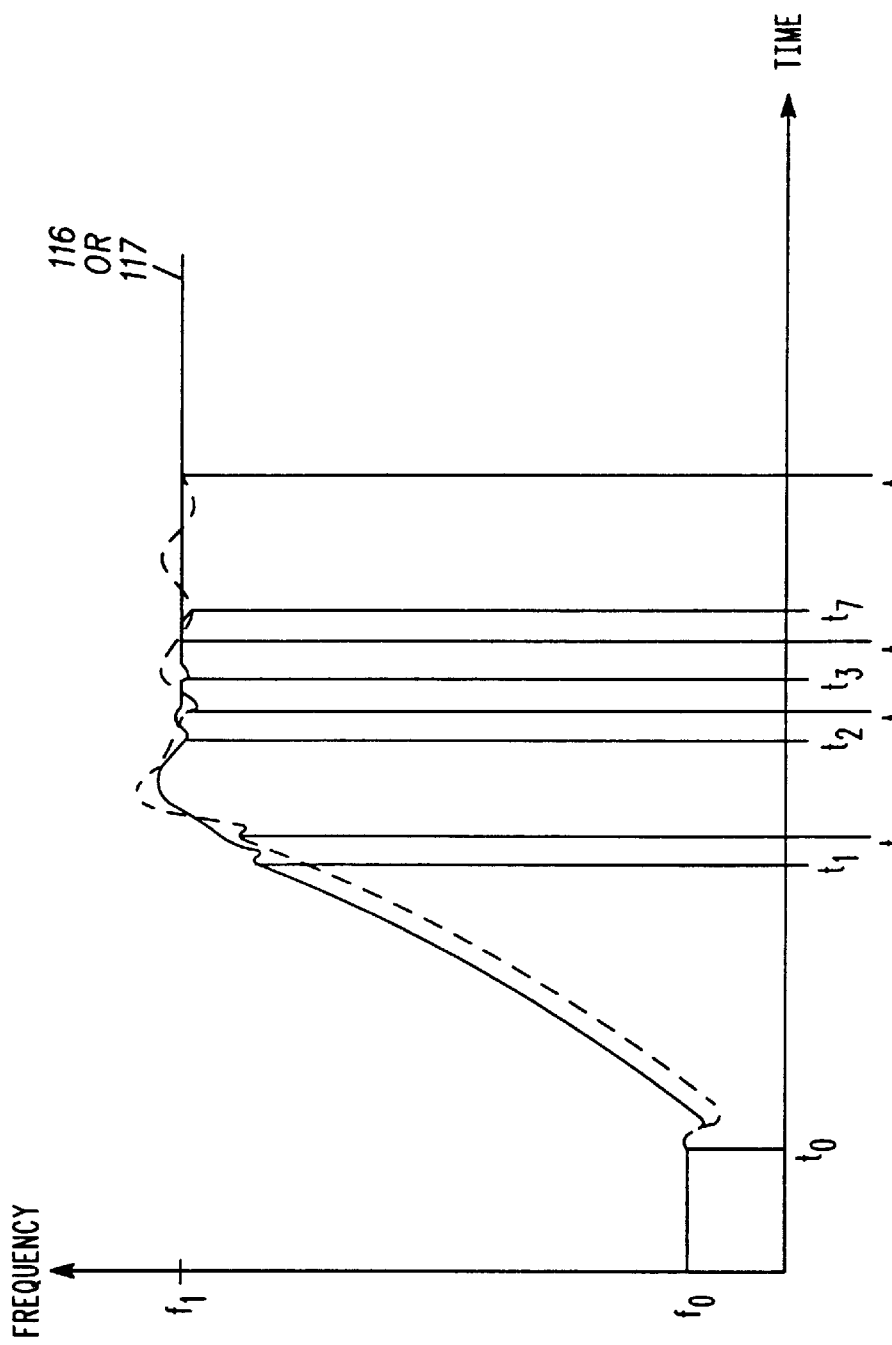
FIG. 4 illustrates a graph of an output frequency signal versus time for the PLL of FIG. 3 in accordance with the present invention.

FIG. 4 illustrates a graph of an output frequency signal 116 or 117 of the PLL 300 of FIG. 3 in accordance with the present invention. In FIG. 4, the frequency of the output frequency signal 116 or 117 is plotted on the vertical axis and time is plotted on the horizontal axis. The solid line shown indicates the output frequency signal 116 or 117 of PLL 300 under transient conditions in accordance with the preferred embodiment of the present invention. The dotted line indicates the output frequency signal 116 or 117 of a prior art PLL 212 under the same transient conditions. The transient conditions occur during the time period when the output frequency 116 or 117 converges from a low frequency, f0, to a high frequency, f1. Similar transient conditions also occur when the output frequency 116 or 117 converges from the high frequency to the low frequency. The PLL 300, by example, has four bandwidth states.

According to the preferred embodiment of the present invention, as shown by the solid line, the PLL 300 operates in the first bandwidth state before time t0. The PLL 300 operates in a fourth bandwidth state between times t0 and t1, in a third bandwidth state between times t1 and t2; in a second bandwidth state between times t2 and t3; and in the first bandwidth state after time t3. The transient condition is detected by the signal detector 305 at time t0, t1, t2, and t3. The novel phase or frequency error suppressing circuit 301 operates to suppress the phase or frequency error generated by the transient condition at time t0, t1, t2, and t3. The output frequency signal 116 or 117 converges to the second frequency, f1, at time t4.

The frequency of the output frequency 116 or 117 of the prior art PLL 212 under the same transient conditions is shown as the dotted line on FIG. 4. The PLL 212 also operates in a fourth bandwidth state between times t0 and t5, in a third bandwidth state between times t5 and t6; in a second bandwidth state between times t6 and t7; and in the first bandwidth state after time t7. Without the novel phase or frequency error suppressing circuit 301, the transient conditions at time t0, t5, t6, and t7 generate greater disturbance on the output frequency signal 116 or 117. The output frequency signal 116 or 117 of the prior art PLL 212 does not converge to the second frequency, f1, until time t8. The time difference between t4 and t8 is the locktime difference between the novel PLL 300 of the present invention and a prior art PLL 212. Therefore, the present invention is advantageously used for the PLL 300 when the PLL 300 switches from one bandwidth state to another bandwidth state.

Figure 5:
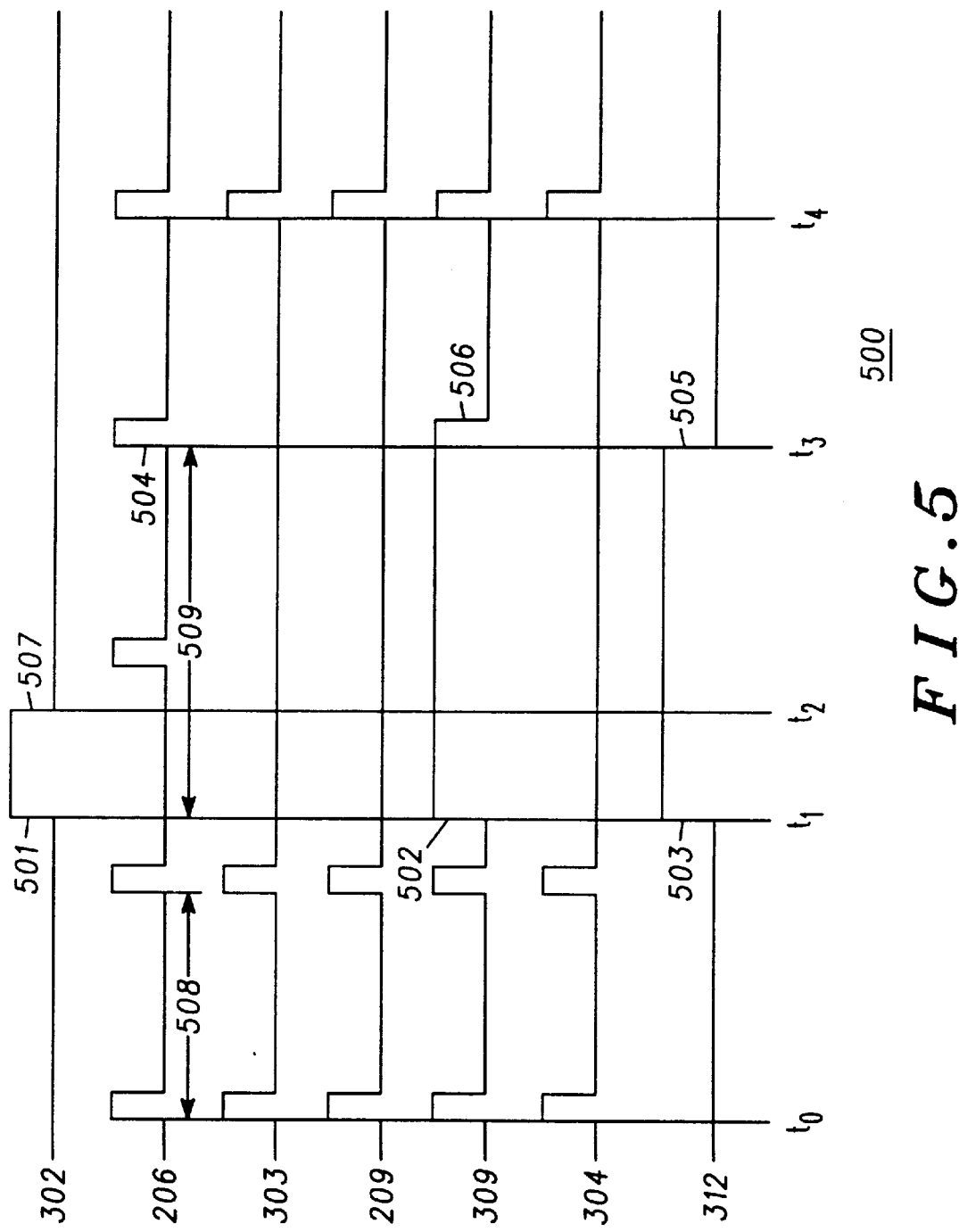
FIG. 5 is a timing diagram illustrating digital signals in a phase or frequency error suppressing circuit in the PLL of FIG. 3 in accordance with the present invention.

FIG. 5 is a timing diagram illustrating digital signals in a phase or frequency error suppressing circuit 301 in the PLL 300 of FIG. 3 in accordance with the present invention.

The timing diagram shows the indication of the transient condition 302, the indication of the reference frequency signal 206, the gated indication of the reference frequency signal 303, the feedback signal 209, the synchronized feedback signal 309, the gated synchronized feedback signal 304, and the timing signal 312.

The indication of the transient condition 302 has a rising edge 501 and a falling edge 507. The indication of reference frequency signal 206 has a rising edge 504. The synchronized feedback signal 309 has a rising edge 502 and an falling edge 506. The timing signal 312 has a rising edge 503 and a falling edge 505.

The indication of the reference frequency signal 206 has a time period 508. The loop of the PLL 300 is opened during the time period 509. When the synchronized feedback signal 309 is high, the loop divider 205 is disabled. When the indication of the transient condition 302 is high, phase or frequency error in the output frequency signal 116 or 117 is generated.

At time t0, the indication of the transient condition is low, hence the PLL 300 operates in its normal mode.

At time t1, a transient condition is indicated by the rising edge 501. The signal detector 305 opens the first and the second gate circuit 311 and 310, respectively, to open the loop of the PLL 300. The signal detector 305 also readies the synchronization circuit 307, and starts the time delay circuit 306. The rising edge 503 indicates the start of the time delay period. The time delay circuit 306 determines the period of time 509 that the loop remains open. The rising edge 502 resets and prepares the loop divider 205 for synchronization. The loop is to remain opened until the falling edge 505.

At time t2 and before time t3, the indication of the transient condition ends corresponding to the falling edge 507. In the preferred embodiment of the present invention, the length of the time delay is responsive to the indication of the reference frequency signal 206. Therefore, the end of the time delay period indicated by the falling edge 505 is responsive to the rising edge 504 at time t3.

At time t3, the phase of the indication of the reference frequency signal 206 and the phase of the feedback signal 209 is synchronized. The falling edge 506 is synchronized with respect to the rising edge 504, and enables the loop divider 205. By disabling the loop divider 205 when the indication of the transient condition 302 is high between time t1 and t2, the PLL will not react to the phase or frequency error while the phase or frequency error being generated by the transient condition. In addition, by synchronizing the synchronized feedback signal 304 to the indication of the reference frequency signal 206 at time t3, the phase error generated by the transient condition will automatically be corrected by the synchronization process, and no phase error will be present at time t4.

At time t4, If a frequency error is generated by the transient condition during time t1 and t2, the loop will begin correcting for the frequency error according to its normal PLL operation.

Figure 6:
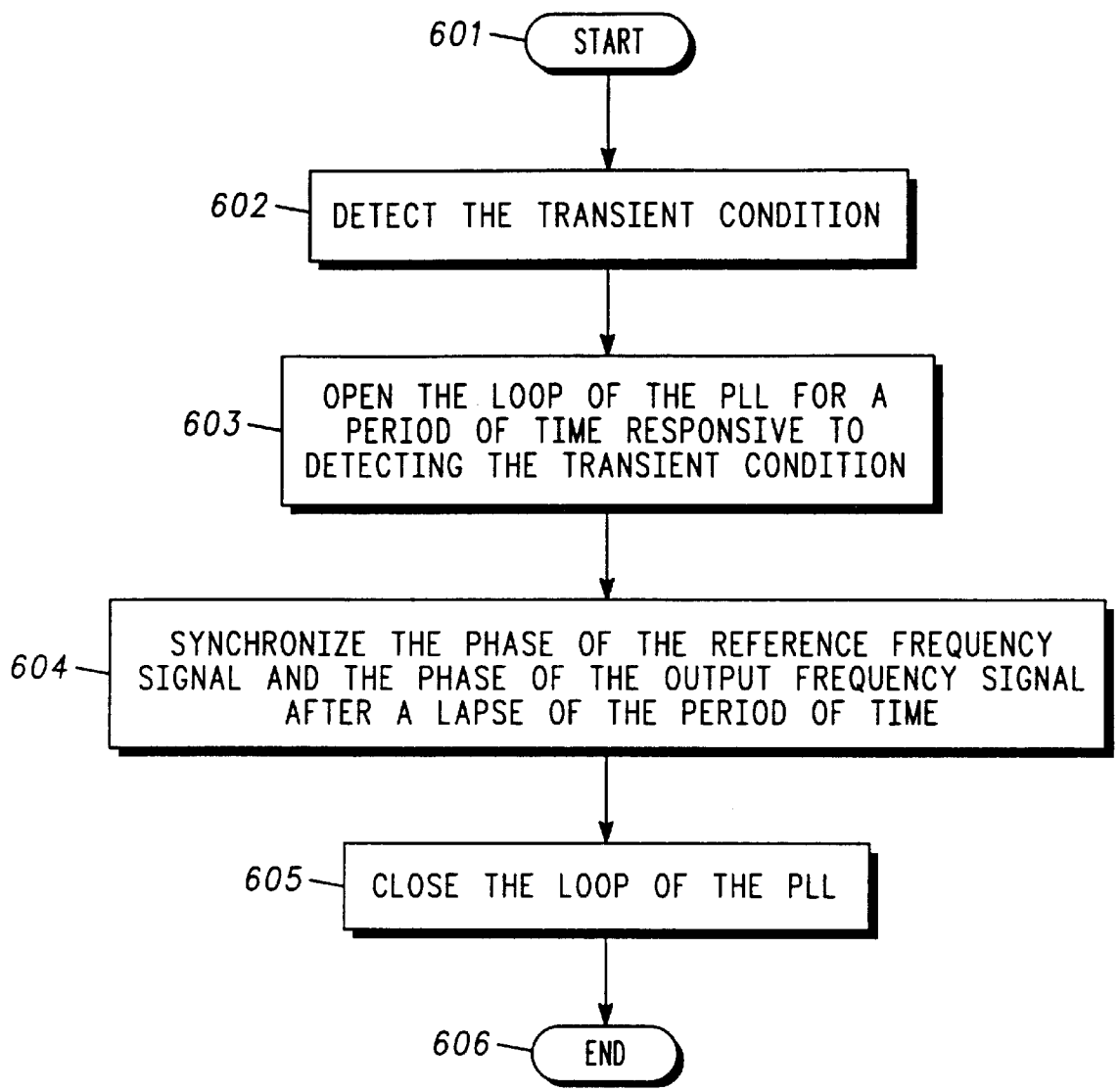
FIG. 6 illustrates a flow chart describing steps for suppressing a phase or frequency error of the PLL of FIG. 3 in accordance with the present invention.

FIG. 6 illustrates a flow chart describing steps for suppressing the phase or frequency error for a PLL 300 of FIG. 3 in accordance with the present invention. The flow chart starts at step 601.

At step 602, a transient condition is detected by the signal detector 305.

At step 603, The signal detector 305 opens the first and the second gate circuit 311 and 310, respectively, readies the synchronization circuit 307, and starts the time delay circuit 306 responsive to the transient condition detected by the signal detector 305. The period of time that the loop is to remain open is controlled by the time delay circuit 306.

At step 604, the synchronization circuit 307 synchronizes the phase of the indication of the reference frequency signal 206 and the phase of the output frequency signal 209 after a lapse of the predetermined period of time determined by the time delay circuit 306.

At step 605, the loop of the PLL 300 is closed by the closing of the first and the second gate circuit 311 and 310, respectively, responsive to the control signal 313 generated by the signal detector 305. The control signal 313 is responsive to the synchronization of the phase of the indication of the reference frequency signal 206 and the phase of the output frequency signal 116 or 117.

The flow chart ends at step 606.

Thus, the present invention provides an error suppressing circuit and method therefor for a phase locked loop. The present invention advantageously minimizes or eliminates false frequency error measurement of a temporarily disturbed output frequency signal 116 or 177. The loop of the PLL 300 is opened for a period of time to allow the disturbed output frequency signal 116 or 117 to settle. After a lapse of the predetermined period of time, the phase of the indication of the reference frequency signal 206 and the phase of the feedback signal 209 are synchronized to reduce the loop phase error before closing the loop of the PLL 300. Any residual frequency error caused by the transient condition is rapidly corrected for by the PLL operation after the loop is closed. The invention is capable of operating with various types of PLLs, and overcomes the disadvantage of the length of time it takes for the PLL to correct for the phase and frequency error generated by the transient condition.

While the present invention has been described with reference to illustrative embodiments thereof, it is not intended that the invention be limited to these specific embodiments. Those skilled in the art will recognize that variations and modifications can be made without departing from the spirit and scope of the invention as set forth in the appended claims.

What is claimed is:

1. In a phase locked loop (PLL) that generates an output frequency signal responsive to a reference frequency signal, the output frequency signal and the reference frequency signal each being characterized by phase and frequency, the PLL having a loop bandwidth, the PLL being susceptible to generating a phase or a frequency error in the output frequency signal responsive to a change in the loop bandwidth of the PLL, a method for suppressing the phase or the frequency error generated in the output frequency signal responsive to the change in the loop bandwidth of the PLL, the method comprising the steps of:

receiving a request to lock the frequency of the output frequency signal to a predetermined frequency;

adjusting the loop bandwidth of the PLL to a first loop bandwidth responsive to the step of receiving;

locking the frequency of the output frequency signal to substantially the predetermined frequency responsive to the step of adjusting the loop bandwidth of the PLL to the first bandwidth;

adjusting the loop bandwidth of the PLL to a second loop bandwidth, narrower than the first loop bandwidth, responsive to the step of locking;

opening the PLL for a period of time responsive to one of the step of locking and the step of adjusting the loop bandwidth of the PLL to the second loop bandwidth to permit the frequency error in the output frequency signal to reach a favorable level;

synchronizing the phase of the reference frequency signal and the phase of the output frequency signal after a lapse of the period of time to substantially eliminate the phase error in the output frequency signal; and closing the PLL responsive to the phase of the reference frequency signal and the phase of the output frequency signal being synchronized;

wherein the predetermined frequency of the output frequency signal before the PLL is opened is substantially the same frequency as the predetermined frequency of the output frequency signal after the PLL is closed.

2. A method according to claim 1 wherein the step of receiving comprises the step of: receiving a request to change the frequency of the output frequency signal between a first frequency channel and a second frequency channel.

3. A method according to claim 1 wherein the steps of opening and closing further comprises disabling and enabling, respectively, a phase detector of the PLL.

4. A method according to claim 1 wherein the period of time is predetermined.

5. A method according to claim 1 wherein the period of time is responsive to a duration of time during which the phase or the frequency error is generated in the output frequency signal.

6. In a phase locked loop (PLL) that generates an output frequency signal responsive to a reference frequency signal, the output frequency signal and the reference frequency signal each being characterized by phase and frequency, the output frequency signal being divided to produce a feedback signal, the PLL being susceptible to generating a phase or frequency error in the output frequency signal responsive to a transient condition, an apparatus for suppressing the phase or the frequency error generated in the output frequency signal responsive to the transient condition, the apparatus comprising:

a signal detector coupled to receive an indication of the transient condition, an indication of the reference frequency signal, the feedback signal, and a reset signal, and operative to produce a control signal;

a time delay circuit coupled to receive the indication of the transient condition, the indication of the reference frequency signal, and the control signal, and operative to produce a timing signal;

a synchronization circuit coupled to receive the indication of the transient condition, the output frequency signal, the control signal, and the timing signal, and operative to produce the reset signal and a synchronization signal;

a logic circuit coupled to receive the synchronization signal and the feedback signal, and operative to produce a synchronized feedback signal;

a first gate circuit operative to transmit the indication of the reference frequency signal responsive to the control signal; and a second gate circuit operative to transmit the synchronized feedback signal responsive to the control signal.

7. An apparatus according to claim 6 wherein the transient condition is an indication to change a loop bandwidth of the PLL.

* * * * *

UNITED STATES PATENT AND TRADEMARK OFFICE
CERTIFICATE OF CORRECTION

PATENT NO. : 5,838,202
DATED : February 26, 1999
INVENTOR(S) : Kosiec

It is certified that error appears in the above-indentified patent and that said Letters Patent is hereby corrected as shown below:

Title Page
===

Item [57] Abstract
   In line 12, replace "envention" with --invention--.

Signed and Sealed this

First Day of June, 1999

Attest:

Q. TODD DICKINSON

*Attesting Officer*      *Acting Commissioner of Patents and Trademarks*